United States Patent [19]

Wolfinger

[11] 4,322,790

[45] Mar. 30, 1982

[54] CALIBRATION SOURCE FOR INSTRUMENTS TO MEASURE POWER AND NEGATIVE SEQUENCE CURRENT OF DYNAMOELECTRIC MACHINES

[75] Inventor: John F. Wolfinger, Schenectady, N.Y.

[73] Assignee: General Electric Company, Schenectady, N.Y.

[21] Appl. No.: 97,555

[22] Filed: Nov. 26, 1979

[51] Int. Cl.³ ............................................. H02M 5/00
[52] U.S. Cl. .................................. 363/148; 307/151; 328/24; 331/45
[58] Field of Search ................. 307/13, 151; 323/212; 324/108, 138; 328/21, 22, 24, 55, 62, 182; 331/45; 363/2, 4, 148, 149

[56] References Cited
U.S. PATENT DOCUMENTS 3,144,599  8/1964  Brahm .............................. 331/45 X
3,225,282 12/1965  Haas, Jr. ........................... 331/45 X
3,832,641  8/1974  Herchenroeder ................. 331/45 X
3,886,449  5/1975  Wolfinger ........................... 324/142
4,156,186  5/1979  Wolfinger ........................... 324/108

*Primary Examiner*—William M. Shoop
*Attorney, Agent, or Firm*—Ormand R. Austin; John F. Ahern

[57] ABSTRACT

A calibration signal source for instruments to measure power and negative sequence current of a multi-phase electric power generator. Separate signals are provided to represent load current for each phase of the generator ultimately to be tested, and to represent the instantaneous differences in voltage between each phase and a reference phase. The calibration signals are derived from a single sine wave by providing a plurality of phase shift and voltage difference networks. Means are provided for amplitude control and elimination of harmonic distortion of the single sine wave, and therefore the output calibration signals share these characteristics.

12 Claims, 3 Drawing Figures

CALIBRATION SOURCE FOR INSTRUMENTS TO MEASURE POWER AND NEGATIVE SEQUENCE CURRENT OF DYNAMOELECTRIC MACHINES

The present invention relates to the calibration of instruments useful for measuring real power, reactive power, the unbalanced component of power, and negative sequence current or voltage of a multi-phase electrical power generator.

BACKGROUND OF THE INVENTION

Instruments to measure certain electrical quantities produced by multi-phased power generators have been developed and applied over the years as analytical tools to improve and maintain the efficiency and operating capabilities of these machines. Among such instruments are those which measure instantaneous power, reactive power, the unbalanced component of power, and the negative sequence current which results from an unbalanced load condition. For these four quantities, on a three-phase dynamoelectric machine, five operating parameters are useful as instrument inputs. These include the difference in voltage between each of two of the phases and the remaining third phase, and the three load currents, i.e., one for each phase.

Heretofore, such performance checks or calibration procedures have been possible only by making a laborious and time-consuming series of secondary measurements followed by calculations of results which were then compared to the quantities being measured directly. This requirement has seriously detracted from the utility and convenience of having instruments such as those mentioned above. In addition, the difficulty of acquiring the secondary measurements simultaneously, significantly affects accuracy since some quantities are susceptible to change as information on other quantities is being acquired.

It is therefore a principal object of the present invention to provide a calibration signal source by which the accuracy of instruments to measure instantaneous power, reactive power, the unbalanced component of power, and the negative sequence current of an operating dynamoelectric machine can quickly and reliably be established.

It is a further object of this invention to provide a calibration source for instruments to measure such parameters in a manner whereby calibration signal values are available simultaneously.

Still further objects will be apparent to those skilled in the art from the ensuing description of the principles and operation of the invention.

SUMMARY OF THE INVENTION

Accordingly, the calibration source of the present invention includes means for generating a constant amplitude, harmonic-free sine wave having the same frequency as the operating frequency of the multiphase generator for which tests are to be performed. For a three-phase generator, two additional sine waves are then derived from the first by means of phase shift networks. There is then provided a set of three constant amplitude sine waves separated from each other in phase angle by 120 degrees. This set of three sine wave signals is applied to voltage difference networks which provide two interphase voltage calibration signals by subtracting the instantaneous value of each of two of the sine waves from the third. Simultaneously, two of the three sine wave signals are applied to the phase shift networks to allow selected amounts of phase shift, which, with the third sine wave (unshifted in phase), provides current calibration signals simulating currents in the three phases of the dynamoelectric machine.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

DETAILED DESCRIPTION OF THE INVENTION

Figure 1:
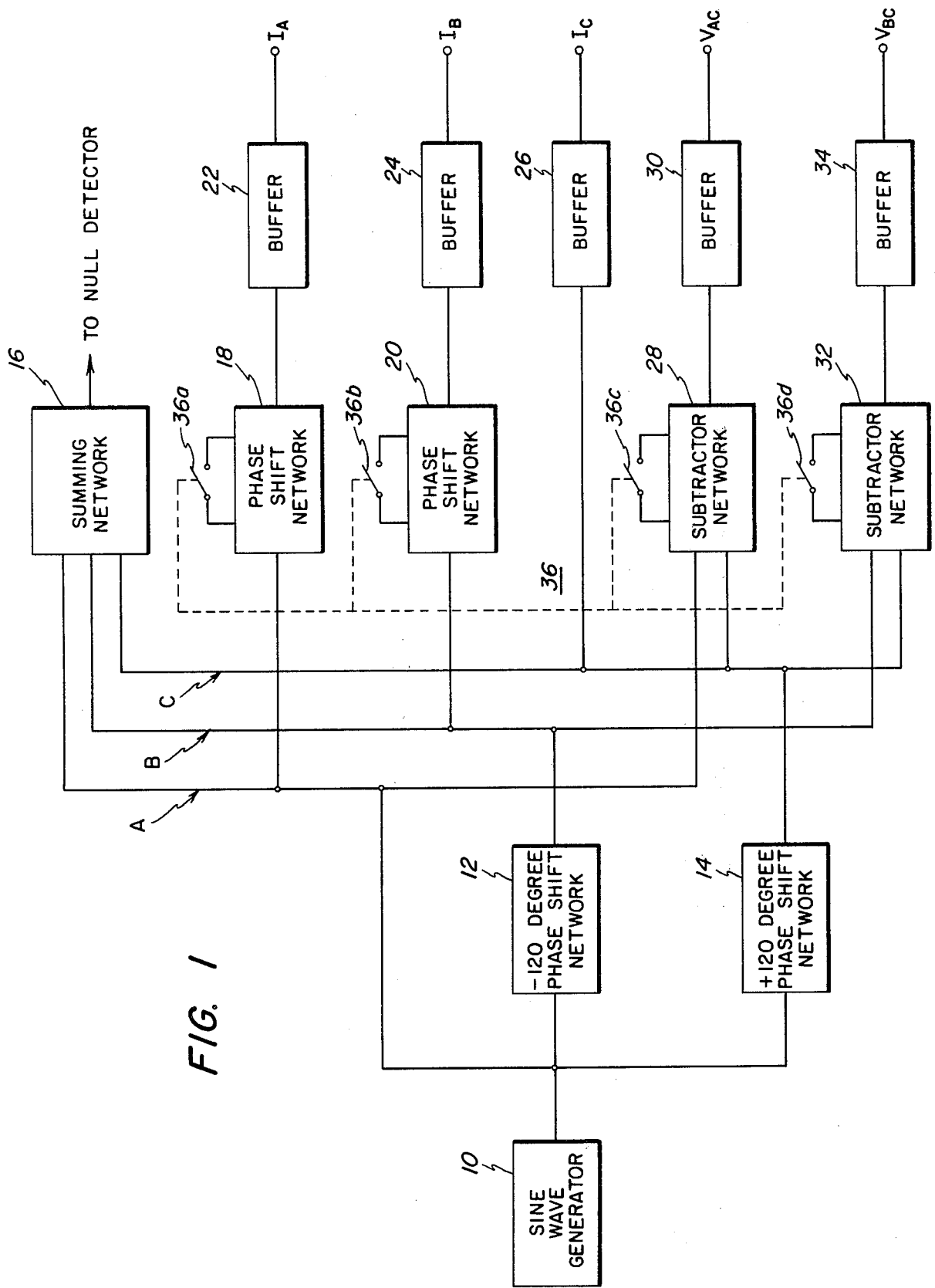
FIG. 1 is a block diagram of a preferred embodiment of the invention for a three-phase dynamoelectric machine.

In the block diagram of FIG. 1 a sine wave generator 10 provides an amplitude-regulated, substantially pure (harmonic-free), sine wave at the power generation frequency. This frequency will typically be 60 Hz in the United States, but in any case the sine wave frequency will be identical to that of the machine ultimately to be examined. For a three-phase machine, as is the case under consideration here, a set of three sine wave signals 120 degrees apart in their phase relationships are provided at circuit points A, B, and C corresponding to generator phases which may be similarly designated. The three sine waves are obtained by deriving two additional sine waves from the first, each of which is separated by 120 degrees from the other. Phase shift networks 12 and 14 provide, respectively, plus and minus 120 degrees of phase shift to the sine wave supplied by sine wave generator 10. The sine wave from sine wave generator 10 is applied to circuit point A without further phase shift.

Summing network 16 accepts the set of three sine waves simultaneously and provides a nulled output if the set of equal amplitude sine wave signals are precisely separated by 120 degrees.

The remainder of the circuitry of FIG. 1 is provided to acquire the desired five calibration signals representing line currents and interphase voltage differences of a three-phase generator. Phase shift networks 18 and 20 apply preselected amounts of phase shift, respectively, to the first and second sine wave signals appearing at circuit points A and B. The signal from phase shift network 18 passes through buffer amplifier 22 and appears as one of the calibration signals $I_A$ representing load current in one generator phase. The signal from phase shift network 20 passes through buffer amplifier 24 and appears as calibration signal $I_B$ representing load current in a second generator phase. The third sine wave signal appearing at circuit point C is applied without phase shift to buffer amplifier 26 and is passed thereby to appear as calibration signal $I_C$ representing load current in the remaining phase of the generator.

A signal representative of the instantaneous difference between the first and third sine wave signals (circuit points A and C) is provided by subtractor network 28 and is passed by buffer amplifier 30 to provide calibration signal $V_{AC}$ representing the difference in voltage between generator phases A and C.

Similarly, a signal $V_{BC}$ which is the instantaneous difference between the second and third sine wave signals (circuit points B and C) is provided by voltage difference network 32 and buffer amplifier 34 and is representative of the difference in voltage between generator phases B and C.

A selector switch 36 comprising switch sections 36a, 36b, 36c, and 36d is provided to allow phase shifter networks 18 and 20 and voltage difference networks 28 and 32 to be set in either of two states so that an electrical power generator operating under two different conditions can be simulated. For example, in one position of the selector switch 36, the five output calibration signals may represent a generator having balanced loads and thus 100 percent real power, but not having any reactive power, unbalanced components of power, or negative sequence current. In the other position the five output calibration signals may represent a generator operating with unbalanced loads, in which case these other parameters are set to predetermined values.

Figure 2A:
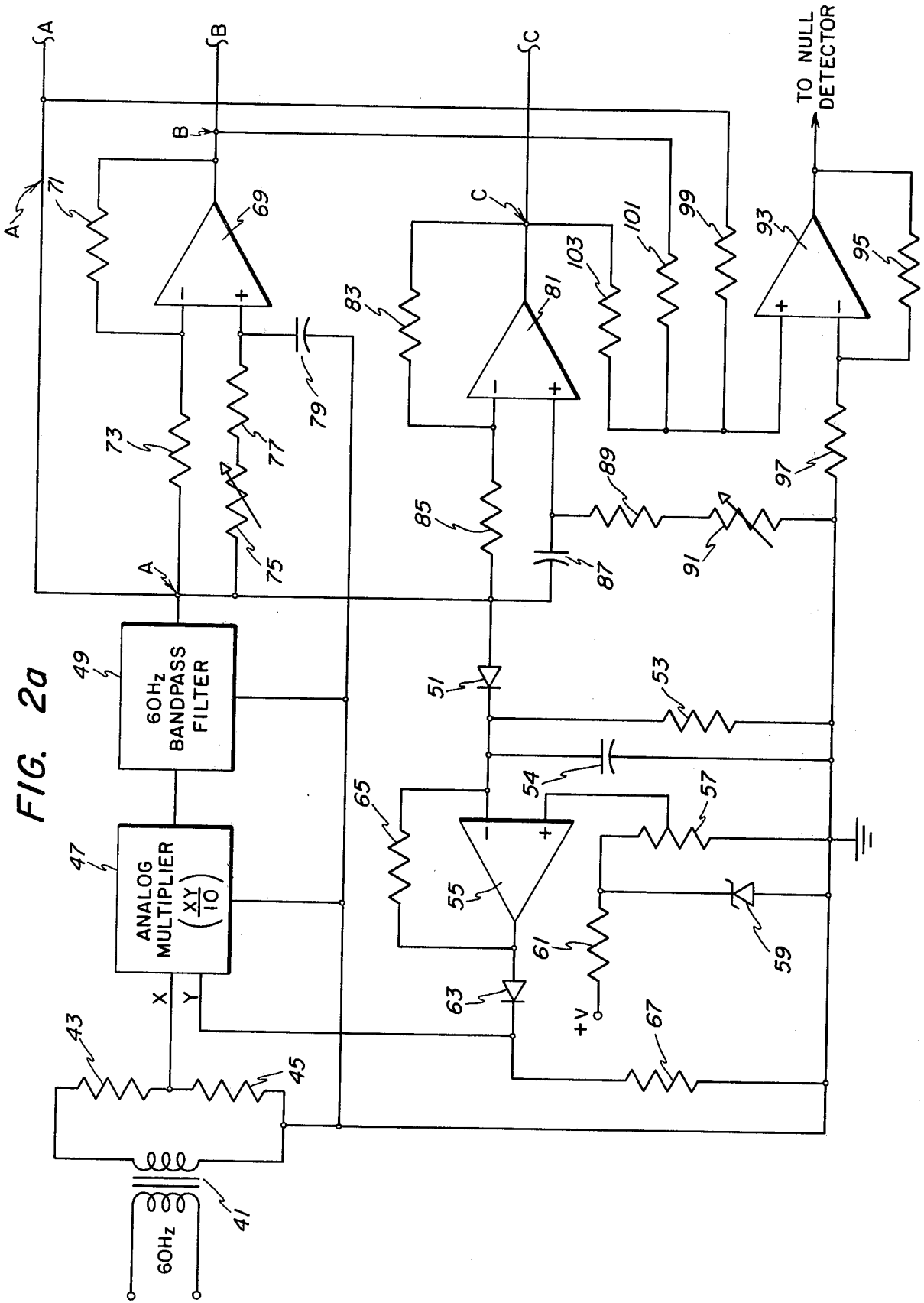
FIGS. 2a and 2b are detailed circuit diagrams of the preferred embodiment of FIG. 1.
Figure 2B:
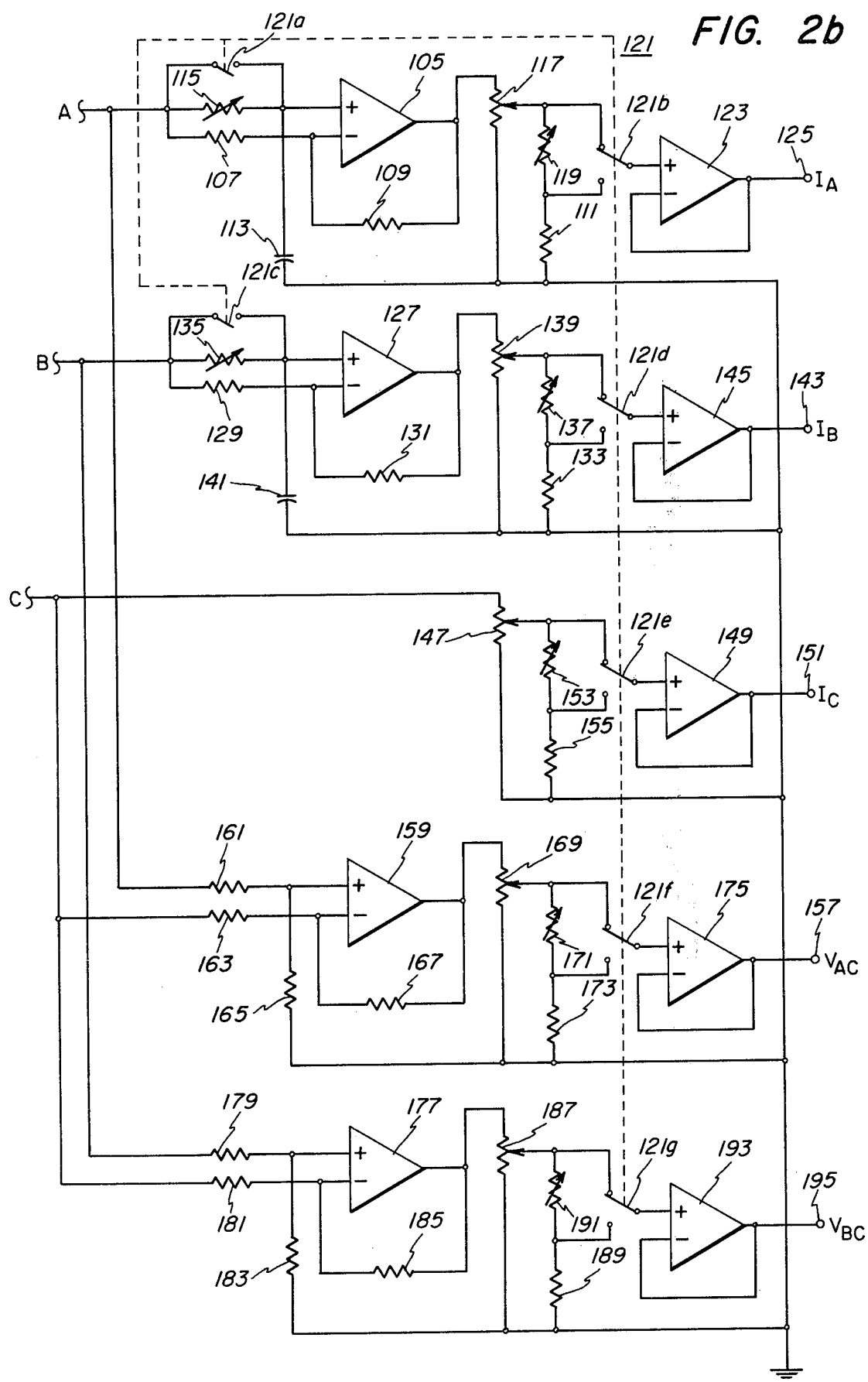

In the circuit diagram of FIG. 2 a transformer 41 is connected through its primary winding to a conventional source of alternating current. For purposes of explaining the principles and operation of the invention the alternating-current source may be taken as having a frequency of 60 Hz. The selected frequency in any case must be equal to that of the generator ultimately to be tested. The 60 Hz input to transformer 41, since obtained from a common source of supply, is unlikely to be a pure sine wave but will have certain distortions due to its harmonic content.

The 60 Hz signal from the secondary of transformer 41 is applied, through a voltage divider formed of resistors 43 and 45, to the X input of analog multiplier 47. Analog multiplier 47 is a conventional device which provides an output signal representative of the product of the X input and a second input Y which will be more fully discussed hereinafter. The output product of X and Y, divided by ten for scaling purposes, is applied to a 60 Hz bandpass filter 49 which is of conventional design but which is effective to sharply attenuate frequencies outside a very narrow band centered around the 60 Hz value. Bandpass filter 49 eliminates harmonic distortion of the fundamental 60 Hz signal to produce a substantially pure sine wave signal at circuit point A which may, along with circuit points B and C, be regarded as the same as those identically marked in FIG. 1.

To maintain the amplitude of the sine wave at circuit point A at a constant value, a feedback loop is provided from circuit point A to the Y input of analog multiplier 47. The feedback loop is effective to change the magnitude of the Y input signal by an amount and in a direction that maintains a constant amplitude signal at A. For this purpose, the sine wave output of bandpass filter 49 is rectified by diode 51 which conducts on the positive half cycle of the sine wave to develop a half-wave rectified signal across resistor 53 and capacitor 54. This dc signal is applied to the inverting input of amplifier 55 and compared thereby with a preselected reference signal applied to the non-inverting input of amplifier 55. The reference signal is obtained from a voltage regulator network comprised of potentiometer 57, voltage regulating diode 59, and resistor 61. The regulator network is connected to a positive dc voltage source which is not specifically shown. The positive polarity output of amplifier 55 is passed via diode 63 to the Y input of analog multiplier 47. Resistor 65 establishes the gain of amplifier 55 while resistor 67 serves as a load therefor. With an increase in magnitude of the signal at A, the positive output of amplifier 55 is decreased, the Y input to multiplier 47 and the output thereof are decreased, and the sine wave at A is restored to the desired amplitude. If the sine wave at A decreases in magnitude, the output of amplifier 55 is increased to cause a corrective effect through multiplier 47 in a similar manner. The amplitude of the sine wave at circuit point A is established by the setting of potentiometer 57 which is adjustable to select the desired amplitude.

The sine wave from circuit point A, at a substantially constant amplitude and free of harmonics, is applied to a first phase shift network comprised of amplifier 69, feedback resistor 71, input resistors 73, 75 and 77 and capacitor 79. The sine wave from circuit point A is simultaneously applied to a second phase shift network comprised of amplifier 81, feedback resistor 83, input resistor 85, capacitor 87, and input resistors 89 and 91. The first phase shift network retards the phase angle of the input sine wave from circuit point A, which sine wave may be referred to herein as the first sine wave, by 120 degrees. The second phase shift network advances the phase angle of the first sine wave by 120 degrees. The amount of retardation in phase angle which occurs in the first phase shift network is determined by input resistors 75 and 77 and capacitor 79 and by their relative values. In the second phase shift network the phase angle advancement and the amount of advancement are determined by capacitor 87, resistors 89 and 91 and by their relative values. Thus, appearing at circuit points A, B and C are first, second and third sine waves which are of substantially constant amplitude, harmonic-free, and separated in phase angle from each other by 120 degrees.

To ensure a precise 120-degree phase separation, the sine wave signals are applied to a summing network comprised of amplifier 93, gain-setting resistors 95 and 97, and input summing resistors 99, 101 and 103. The summing network produces a null, or zero, output only if the three sine waves bear the desired 120-degree phase relationship. A null detector, such as, for example, an oscilloscope may be used to detect the desired condition. If the phase relationship of the set of three sine waves is not as desired (as indicated by other than a nulled output from the summing network), adjustable resistors 75 and 91 may be adjusted until a null condition is achieved.

The first sine wave signal, unshifted in phase, is applied to a third phase shift network comprised of amplifier 105, fixed resistors 107, 109, 111, capacitor 113, and adjustable resistors 115, 117 and 119. The amount of phase shift imparted to the first sine wave signal by the third phase shift network is determined by the setting of adjustable resistor 115. Selector switch 121 is a mechanically ganged, multisection switch including sections 121a and 121b which sections are also included in the third phase shift network. In one position of selector switch 121, adjustable resistor 115 is bypassed by switch section 121a, and the output signal from the third phase shift network is taken directly from the slider arm of adjustable resistor 117 through switch section 121b. In this first position of switch 121, the phase of the first sine wave is unaffected by the third phase shift network since adjustable resistor 115 is bypassed by switch section 121a. In the second position of selector switch 121, adjustable resistor 115 is no longer bypassed, and resistor 115 and capacitor 113 produce a shift in phase angle in the first sine wave. The precise amount of phase shift imparted is preselectable by adjusting the value of resistor 115. Also in the second position of selector switch 121, the output signal from the third phase shift network is taken through adjustable attenuating resistor 119. The signal from switch section 121b is passed by buffer amplifier 123 to an output terminal 125. The signal thus produced, designated $I_A$, is simulative of current flowing from a first phase of a dynamoelectric machine to a load.

The sine wave signal from circuit point B, referred to as the second sine wave signal, is applied to a fourth phase shift network comprised of amplifier 127, fixed resistors 129, 131, and 133, adjustable resistors 135, 137, and 139, and capacitor 141. Sections 121c and 121d of selector switch 121 are also included in the fourth phase shift network. The fourth phase shift network functions in identical fashion to the third phase shift network immediately described above. However, the two phase shift networks do not necessarily impart the same degree of phase shift to their input sine waves. It will be recognized that with selector switch 121 in the first position each network will pass its input signal without a shift in phase.

The signal from the fourth phase shift network passes to output terminal 143 through buffer amplifier 145 and provides a calibration signal $I_B$ simulating load current from a second phase of a dynamoelectric machine.

The sine wave from circuit point C, referred to as the third sine wave, passes without phase shift through adjustable attenuating resistor 147, switch section 121e, through buffer (isolation) amplifier 149, to output terminal 151 where it appears as a calibration signal to simulate the output current from a third phase of a dynamoelectric machine. An attenuator network including adjustable resistor 153 and fixed resistor 155 are provided for adjusting the amplitude of the third sine wave in the second position of selector switch 121.

To produce calibration signals simulative of the instantaneous difference in voltage between phases of a dynamoelectric machine, first and second voltage difference networks are provided in the preferred embodiment of FIG. 2. The first of these networks provides an output calibration signal $V_{AC}$ at output terminal 157 by taking the instantaneous difference in voltage between the first and third sine waves appearing, respectively, at circuit points A and C. This first subtractor network is configured from amplifier 159, input resistors 161, 163 and 165, feedback resistor 167, and output attenuator resistors 169, 171, and 173. The difference signal, appearing at the output of amplifier 159 is passed by switch section 121f through buffer amplifier 175 to output terminal 157 where the signal $V_{AC}$ is available for calibration purposes as a simulation of the difference in voltage between the first and third phases of a three-phase dynamoelectric machine. Adjustable resistors 169 and 171 allow the difference signal from amplifier 159 to be set at either of two different amplitude levels depending on the position of switch section 121f.

A second voltage difference network operative to provide the instantaneous difference between the second and third sine wave signals is comprised of amplifier 177, input resistors 179, 181 and 183, feedback resistor 185, and attenuator resistors 187, 189 and 191. The instantaneous difference is passed by switch section 121g through buffer amplifier 193 to output terminal 195 where it is available as a calibration signal $V_{BC}$ representing the voltage difference between the second and third phases of a three-phase dynamoelectric machine.

Selector switch 121 is provided so that circuitry as described above may be set to a first state in which the five calibration signals $I_A$, $I_B$, $I_C$, $V_{AC}$, $V_{BC}$ represent a three-phase generator delivering power to balanced loads (interphase balanced condition) or to a second state in which these signals represent a generator supplying power to unbalanced loads (interphase unbalanced condition). For example, in the first position of switch 121 the calibration signals may represent a generator having 100 percent real power, zero percent reactive power, zero percent unbalanced component of power (referred to as 120 Hz component power for a three-phase 60 Hz machine), and zero percent negative sequence current; and in the second position of selector switch 121 the calibration signals may represent a generator at 95 percent real power, 5 percent reactive power, 2 percent unbalanced component of power, and 5 percent negative sequence current.

While there has been shown and described what is considered a preferred embodiment of the invention, it is understood that various other modifications may be made therein. For example, the invention may be adapted to simulate dynamoelectric machines of other than 60 Hz and other than three phase. It is intended to claim all such modifications which fall within the true spirit and scope of the present invention.

What is claimed is:

1. A signal source for calibrating instruments that measure power and negative sequence current of a multi-phase generator adapted to supply electrical power at a power generation frequency, said signal source comprising:

means for generating a first sine wave signal of frequency equal to said power generation frequency, said first sine wave being substantially free of harmonic content and of substantially constant amplitude;

means for deriving second and third sine wave signals from said first sine wave signal to provide a set of three sine wave signals separated in phase angle by substantially 120 degrees, said second and third sine wave signals having frequency and amplitude characteristics of said first sine wave signal;

means for subtracting said first sine wave signal from said third sine wave signal to provide a first interphase voltage calibration signal;

means for subtracting said second sine wave signal from said third sine wave signal to provide a second interphase voltage calibration signal;

means for shifting the phase of said first sine wave signal by a preselected amount to provide a first phase current calibration signal;

means for shifting the phase of said second sine wave signal by a preselected amount to provide a second phase current calibration signal; and means for buffering said third sine wave signal to provide a third phase current calibration signal.

2. The signal source of claim 1 further including means for switching such signal source between a first state wherein said calibration signals represent signals from a multiphase generator supplying power under interphase balanced conditions and a second state wherein said calibration signals represent signals from a multi-phase generator supplying power under predetermined interphase unbalanced conditions.

3. The signal source of claims 1 or 2 further including means for simultaneously receiving said first, second, and third sine wave signals to verify that said signals are separated in phase by 120 degrees.

4. The signal source of claims 1 or 2 further including means for preselecting the amplitude of said first and second interphase voltage calibration signals.

5. The signal source of claim 3 wherein said means for generating said first sine wave signal includes a multiplier network having a feedback network for controlling the amplitude of said first sine wave signal and a bandpass filter for controlling the harmonic content of said first sine wave signal.

6. The signal source of claim 5 wherein said means for deriving said second and third sine wave signals from said first sine wave signal comprises a pair of phase shift networks, one network of which is adapted to provide said second sine wave signal by decreasing the phase angle of said first sine wave signal by 120 degrees, and the other network of which is adapted to provide said third sine wave signal by increasing the phase angle of said first sine wave signal by 120 degrees.

7. The signal source of claim 6 further including a buffer network for each said calibration signal.

8. A calibration signal generator for calibrating instruments useful to measure power and negative sequence current of a multiphase generator adapted to supply electrical power at a power generation frequency, said signal generator comprising:

a sine wave source producing a first sine wave signal of substantially constant amplitude and of frequency equal to said power generation frequency;

a first phase shift network producing a second sine wave signal from said first sine wave signal separated in phase therefrom by 120 degrees, said second sine wave signal having frequency and amplitude characteristics of said first sine wave signal;

a second phase shift network producing a third sine wave signal from said first sine wave signal separated in phase from said first and second sine wave signals by 120 degrees, said third sine wave signal having frequency and amplitude characteristics of said first sine wave signal;

a first voltage difference network producing an instantaneous difference between said first sine wave signal and said third sine wave signal to provide a first interphase voltage calibration signal;

a second voltage difference network producing an instantaneous difference between said second sine wave signal and said third sine wave signal to provide a second interphase voltage calibration signal;

a third phase shift network shifting the phase of said first sine wave signal to provide a first phase current calibration signal, said third phase shift network having means for preselecting the amount of phase shift to be imparted to said first sine wave signal;

a fourth phase shift network shifting the phase of said second sine wave signal to provide a second phase current calibration signal, said fourth phase shift network having means for preselecting the amount of phase shift to be imparted to said second sine wave signal; and an isolation network for receiving said third sine wave signal from said second phase shift network to provide a third phase current calibration signal.

9. The calibration signal generator of claim 8 further including a selector switch operable between a first position wherein said first and second voltage difference networks and said third and fourth phase shift networks are operative to produce said calibration signals simulative of a multiphase generator supplying power under interphase balanced conditions and a second position wherein said networks are operative to produce said calibration signals simulative of a multiphase generator supplying power under preselected interphase unbalanced conditions.

10. The calibration signal generator of claim 9 further including a network for summing said first, second, and third sine wave signals, said summing network adapted to produce a null indication when said sine wave signals bear a 120-degree phase separation.

11. The calibration signal generator of claim 10 wherein said first and second voltage difference networks include means for preselecting the amplitude of said first and second interphase voltage calibration signals.

12. The calibration signal generator of claim 11 wherein said sine wave source includes a multiplier network and a feedback network for controlling the amplitude of said first sine wave signal, and a bandpass filter for eliminating harmonic distortion.

* * * * *